(12) United States Patent
Somaschini et al.

(10) Patent No.: US 9,172,037 B2
(45) Date of Patent: Oct. 27, 2015

(54) COMBINED CONDUCTIVE PLUG/CONDUCTIVE LINE MEMORY ARRAYS AND METHODS OF FORMING THE SAME

(71) Applicant: Micron Technology, Inc., Boise, ID (US)

(72) Inventors: Roberto Somaschini, Vimercate (IT); Fabio Pellizzer, Cornate d'Adda (IT); Carmela Cupeta, Milan (IT); Nicola Nastasi, Monza (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/252,145

(22) Filed: Apr. 14, 2014

(65) Prior Publication Data

US 2014/0252300 A1    Sep. 11, 2014

Related U.S. Application Data

(62) Division of application No. 13/364,382, filed on Feb. 2, 2012, now Pat. No. 8,716,059.

(51) Int. Cl.
*H01L 29/02* (2006.01)
*H01L 45/00* (2006.01)
*H01L 27/24* (2006.01)

(52) U.S. Cl.
CPC ............ *H01L 45/14* (2013.01); *H01L 27/2427* (2013.01); *H01L 27/2463* (2013.01); *H01L 45/06* (2013.01); *H01L 45/1233* (2013.01); *H01L 45/1253* (2013.01); *H01L 45/144* (2013.01); *H01L 45/16* (2013.01)

(58) Field of Classification Search
CPC ......... H01L 45/04; H01L 29/00; H01L 27/24; G11C 13/0004
USPC .................. 257/1–5, E29.002; 438/102–104
See application file for complete search history.

(56) References Cited

U.S. PATENT DOCUMENTS

| | | | |
|---|---|---|---|
| 7,459,716 B2 * | 12/2008 | Toda et al. | 257/2 |
| 7,642,125 B2 | 1/2010 | Lung et al. | |
| 8,049,200 B2 | 11/2011 | Liu | |
| 2006/0292802 A1 * | 12/2006 | Lee et al. | 438/264 |
| 2007/0155172 A1 * | 7/2007 | Lai et al. | 438/666 |
| 2008/0191187 A1 * | 8/2008 | Lung et al. | 257/4 |
| 2010/0301303 A1 | 12/2010 | Wang et al. | |
| 2010/0327252 A1 | 12/2010 | Lee | |

* cited by examiner

*Primary Examiner* — Jami M Valentine
(74) *Attorney, Agent, or Firm* — Brooks, Cameron & Huebsch, PLLC

(57) ABSTRACT

Memory arrays and methods of forming the same are provided. One example method of forming a memory array can include forming a conductive material in a number of vias and on a substrate structure, the conductive material to serve as a number of conductive lines of the array and coupling the number of conductive lines to the array circuitry.

18 Claims, 4 Drawing Sheets

COMBINED CONDUCTIVE PLUG/CONDUCTIVE LINE MEMORY ARRAYS AND METHODS OF FORMING THE SAME

PRIORITY INFORMATION

The present application is a divisional of U.S. application Ser. No. 13/364,382, filed Feb. 2, 2012, which is incorporated by reference.

TECHNICAL FIELD

The present disclosure relates generally to semiconductor devices and methods, and more particularly to memory arrays and methods of forming the same.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistive memory, and flash memory, among others. Types of resistive memory include phase change memory, programmable conductor memory, and resistive random access memory (RRAM), among others.

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

Various resistive memory devices can include arrays of cells organized in a cross point architecture. In such architectures, the memory cells can include a cell stack comprising a storage element, e.g., a phase change element, in series with a select device, e.g., a switching element such as an ovonic threshold switch (OTS) or diode, between a pair of conductive lines, e.g., between an access line and a data/sense line. The memory cells are located at the intersections of a word line and bit line and can be "selected" via application of appropriate voltages thereto.

Performance of resistive memory cells can be affected by factors such as the types of materials used to form the cells, the quality of interfaces, e.g., contact surfaces, between cell materials, and/or the number of interfaces present in a cell stack, among various other factors. Accordingly, and for various other reasons, formation of resistive memory cells can be costly in terms of processing resources and time.

DETAILED DESCRIPTION

Figure 1:
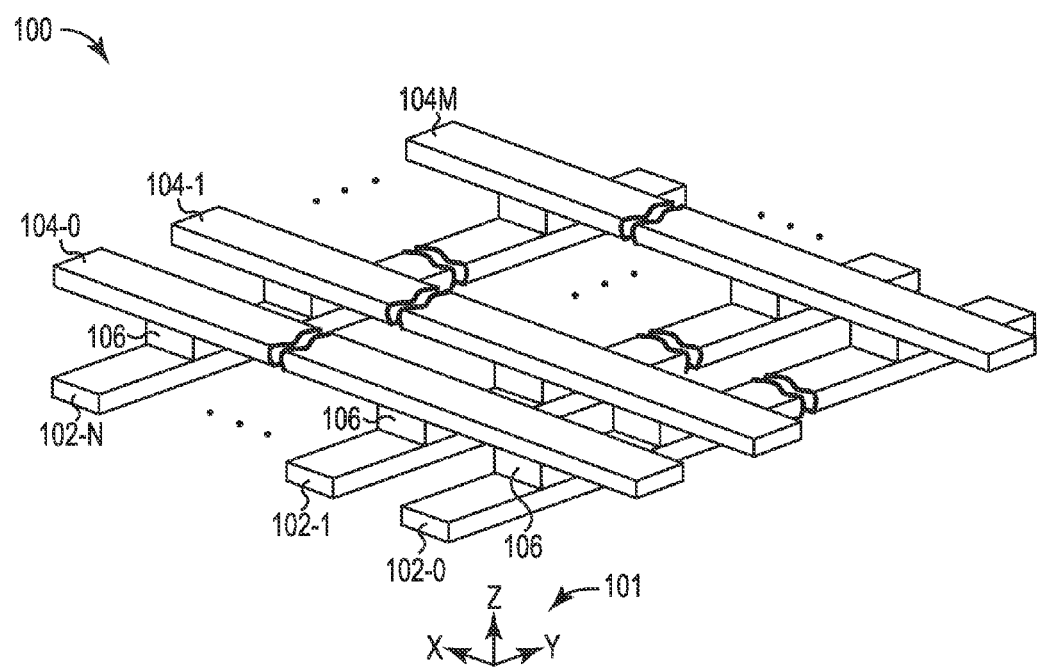
FIG. 1 illustrates a perspective view of a portion of a memory array in accordance with a number of embodiments of the present disclosure.

Memory arrays and methods of forming the same are provided. An example method includes forming a substrate structure including array circuitry, forming a number of vias in the substrate structure such that a number of portions of the array circuitry are exposed, and forming a conductive material in the number of vias and on the substrate structure, wherein the conductive material serves as a number of conductive lines of the array and couples the number of conductive lines to the array circuitry.

Embodiments of the present disclosure can provide benefits such as providing a combined, e.g., integrated, conductive plug/conductive line element that serves as a connection to array circuitry, such as decode circuitry underlying an array of memory cells. The combined conductive plug/conductive line element can be formed of a continuous conductive material such that no interface separates a plug portion of the element and a line portion of the element, which can reduce the path resistance associated with separately formed conductive plug/conductive line structures, for instance. Also, various previous approaches in which a conductive plug is formed separately from a conductive line, e.g., an access line or data/sense line, can include performing a planarization process, e.g., CMP (chemical mechanical planarization), in order to provide a suitable contact interface between the plug and the conductive line. Since a number of embodiments of the present disclosure can include forming an integrated conductive plug/conductive line, which does not include an interface there between, such a CMP process between formation of the plug and formation of the conductive line can be eliminated, which simplifies the array formation process and reduces formation costs associated therewith.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 210 may reference element "10" in FIG. 2, and a similar element may be referenced as 310 in FIG. 3. Also, as used herein, "a number of" a particular element and/or feature can refer to one or more of such elements and/or features.

FIG. 1 illustrates a perspective view of a portion of a memory array 100 in accordance with a number of embodiments of the present disclosure. In this example the array 100 is a cross-point array 100 including memory cells 106 at the intersections of a first number of conductive lines 102-0, 102-1, . . . , 102-N, e.g., access lines, which may be referred to herein as word lines, and a second number of conductive lines 104-0, 104-1, . . . , 104-M, e.g., data lines, which may be referred to herein as bit lines. Coordinate axis 101 indicates that the bit lines 104-0, 104-1, . . . , 104-M are oriented in an x-direction and the word lines 102-0, 102-1, . . . , 102-N are oriented in a y-direction, in this example. As illustrated, the word lines 102-0, 102-1, . . . , 102-N are substantially parallel to each other and are substantially orthogonal to the bit lines 104-0, 104-1, . . . , 104-M, which are substantially parallel to each other; however, embodiments are not so limited. As used herein, the term "substantially" intends that the modified characteristic needs not be absolute, but is close enough so as to achieve the advantages of the characteristic. For example, "substantially parallel" is not limited to absolute parallelism, and can include orientations that are at least closer to a parallel orientation than a perpendicular orientation. Similarly, "substantially orthogonal" is not limited to absolute orthogonalism, and can include orientations that are at least closer to a perpendicular orientation than a parallel orientation.

The cross-point array 100 can be an array structure such as that described below in connection with FIGS. 3 and 4, for instance. As an example, the memory cells 106 can be phase change random access memory (PCRAM) cells, resistive random access memory (RRAM) cells, conductive random access memory (CBRAM) cells, and/or spin transfer torque random access memory (STT-RAM) cells, among other types of memory cells. In various embodiments, the memory cells 106 can have a "stack" structure that includes a select device, e.g., a switching device, coupled in series to a storage element, e.g., a resistive storage element comprising a phase change material or metal oxide. As an example, the select device can be a diode, field effect transistor (FET), a bipolar junction transistor (BJT), or an ovonic threshold switch (OTS), among other switching elements.

In a number of embodiments, the select device and storage element associated with the respective memory cells 106 can be series coupled two-terminal devices. For instance, the select device can be a two-terminal OTS, e.g., a chalcogenide alloy formed between a pair of electrodes, and the storage element can be a two-terminal phase change storage element, e.g., a phase change material (PCM) formed between a pair of electrodes. Memory cells 106 including a switching element such as an OTS in series with a PCM can be referred to as a phase change material and switch (PCMS) memory cells. In a number of embodiments, an electrode can be shared between the select device and storage element of the memory cells 106. Also, in a number of embodiments, the bit lines 104-0, 104-1, . . . , 104-M and the word lines 102-0, 102-1, . . . , 102-N can serve as top or bottom electrodes corresponding to the memory cells 106.

As used herein, a storage element can refer to a programmable portion of a memory cell 106, e.g., the portion programmable to a number of different data states. For example, in PCRAM and RRAM cells, a storage element can include the portion of the memory cell having a resistance that is programmable to particular levels corresponding to particular data states responsive to applied programming signals, e.g., voltage and/or current pulses, for instance. A storage element can include, for instance, one or more resistance variable materials such as a phase change material. As an example, the phase change material can be a chalcogenide alloy such as an indium(In)-antimony(Sb)-tellurium(Te) (IST) material, e.g., $In_2Sb_2Te_5$, $In_1Sb_2Te_4$, $In_1Sb_4Te_7$, etc., or a germanium(Ge)-antimony(Sb)-tellurium(Te) (GST) material, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, or etc., among other phase change materials. The hyphenated chemical composition notation, as used herein, indicates the elements included in a particular mixture or compound, and is intended to represent all stoichiometries involving the indicated elements. Other phase change materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. Other examples of resistance variable materials include transition metal oxide materials or alloys including two or more metals, e.g., transition metals, alkaline earth metals, and/or rare earth metals. Embodiments are not limited to a particular resistive variable material or materials associated with the storage elements of the memory cells 106. For instance, other examples of resistive variable materials that can be used to form storage elements include binary metal oxide materials, colossal magnetoresistive materials, and/or various polymer based resistive variable materials, among others.

Although not illustrated in FIG. 1, in a number of embodiments, the array 100 can be part of a three dimensional (3D) architecture, with a number of arrays 100 vertically stacked on each other. In such embodiments, conductive lines such as 104-0, 104-1, . . . , 104-M can serve as a bit line for one level of the 3D array and as a word line for a subsequent level of the 3D array, for instance. Also, although not illustrated in FIG. 1, the word lines 102-0, 102-1, . . . , 102-N can be combined conductive plug/word lines such as those described below in connection with FIGS. 3 and 4. Additionally, the array 100 can be coupled to array circuitry, e.g., decode circuitry among various other circuitry associated with operating array 100. Such array circuitry can underly array 100, for instance.

In operation, the memory cells 106 of array 100 can be programmed by applying a voltage, e.g., a write voltage, across the memory cells 106 via selected conductive lines, e.g., word lines 102-0, 102-1, . . . , 102-N and bit lines 104-0, 104-1, . . . , 104-M. The width and/or magnitude of the voltage pulses across the memory cells 106 can be adjusted, e.g., varied, in order to program the memory cells 106 to particular logic states, e.g., by adjusting a resistance level of the storage element.

A sensing, e.g., read, operation can be used to determine the logic state of a memory cell 106. For instance, particular voltages can be applied to a bit line 104-0, 104-1, . . . , 104-M and word line 102-0, 102-1, . . . , 102-N corresponding to a selected memory cell 106, and current through the cell responsive to a resulting voltage difference can be sensed. Sensing operations can also include biasing unselected word lines and bit lines, e.g., word lines and bit lines coupled to non-selected cells, at particular voltages in order to sense the logic state of a selected cell 106.

As an example, the array 100 can be operated in accordance with a half select method, e.g., a half select biasing scheme. A half select method can include applying a half select voltage (V/2) to a selected bit line, e.g., a bit line coupled to a selected memory cell, and a negative half select voltage (−V/2) to a selected word line, e.g., a word line coupled to the selected memory cell, while biasing unselected word lines and bit lines at a reference potential, e.g., a ground potential. As such, a full select voltage (V) is applied across the selected memory cell. In this example, the unselected memory cells coupled to the selected bit line and selected word line experience a half select voltage of +/−V/2 and can be referred to as "half selected" cells. The select devices can allow current through selected memory cells, e.g., cells experiencing the full select voltage (V), while blocking or limiting current through unselected cells coupled to a selected word line and bit line, e.g., cells experiencing the half select voltage. In this example, unselected memory cells coupled to unselected bit lines and/ or word lines are unbiased, e.g., they experience a ground potential of 0V, in this example. The select voltage (V) can be a write voltage or a read voltage, for instance. Embodiments of the present disclosure are not limited to a half select method associated with programming or reading cells of array 100. For instance, the array 100 can be operated in accordance with other biasing schemes, such as a one third select method, among other biasing schemes.

Figure 2:
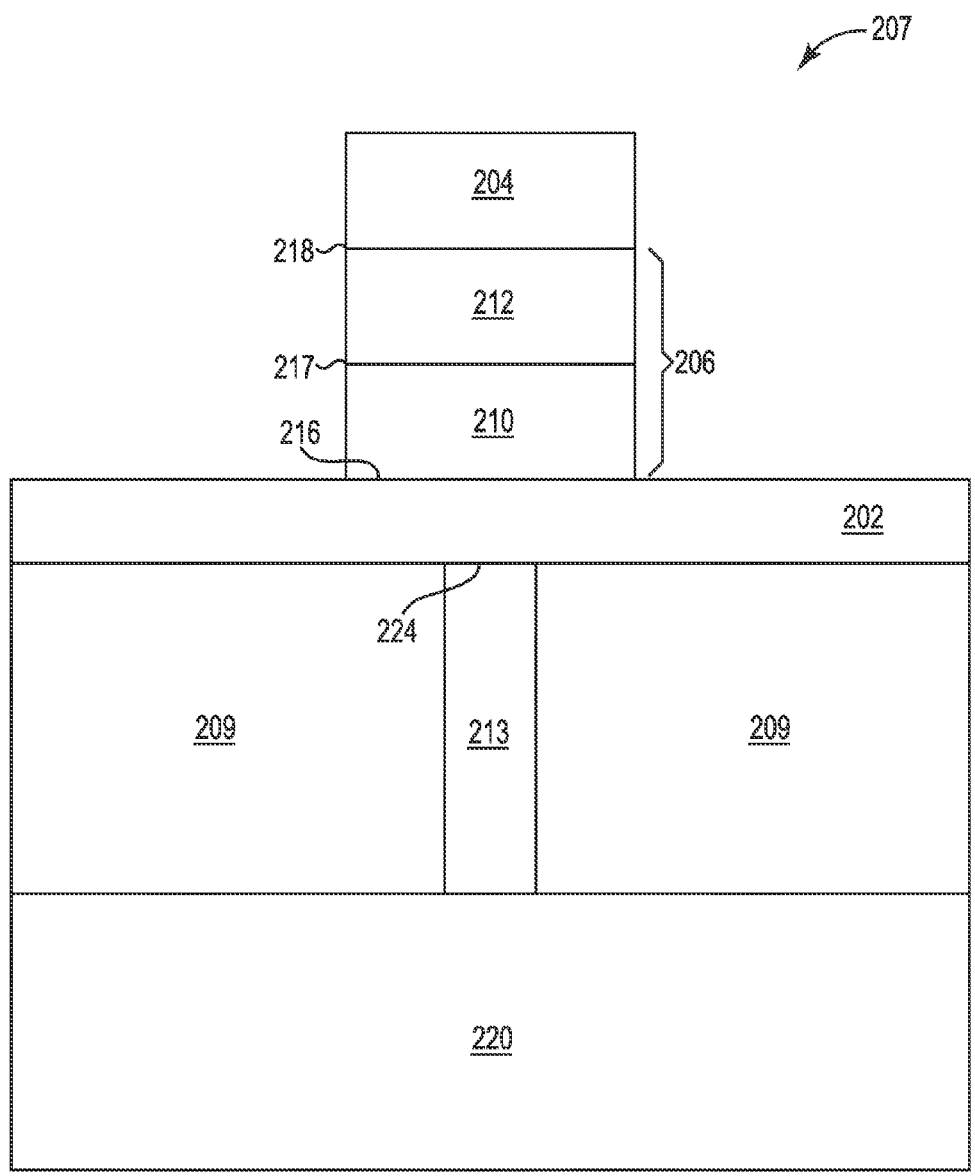
FIG. 2 illustrates a cross-sectional view of a portion of a memory array formed in accordance with a prior art method.

FIG. 2 illustrates a cross-sectional view of a portion of a memory array 207 formed in accordance with a prior art method. For reference purposes, FIG. 2 can represent a cross-section taken along the y-direction (word line direction) through a memory cell 106 shown in FIG. 1.

Array 207 includes a memory cell 206 formed on a substrate 220. As used in the present disclosure, the term "substrate" can include silicon-on-insulator (SOI) or silicon-on-sapphire (SOS) technology, doped and undoped semiconductors, epitaxial layers of silicon supported by a base semiconductor foundation, conventional metal oxide semiconductors (CMOS), e.g., a CMOS front end with a metal backend, and/or other semiconductor structures and technologies. Various circuitry, such as decode circuitry, for instance, associated with operating memory array 207 can be formed in/on substrate 220. Furthermore, when reference is made to a "substrate" in the following description, previous process steps may have been utilized to form regions or junctions in the base semiconductor structure or foundation.

The array 207 includes a conductive plug 213, which can serve to electronically couple a conductive line 202, e.g., word line, of the array 207 to underlying circuitry, e.g., decode circuitry (not shown), formed in/on substrate 220. The conductive plug 213 can be formed by etching a via in a dielectric material 209 formed on substrate 220 and filling the via with a conductive material, which can comprise tungsten, titanium, platinum, nickel, strontium, hafnium, zirconium, tantalum, aluminum, oxides and nitrides thereof, and combinations thereof, among various other conductive and/or semiconductive metals, for instance. The plug 213 and/or conductive line 202 can be formed via a number of deposition processes, e.g., physical vapor deposition (PVD), chemical vapor deposition (CVD), and/or atomic layer deposition (ALD), among others.

FIG. 2 illustrates a conductive material 202 formed on the dielectric material 209 and conductive plug 213. The conductive material 202 can be formed into a conductive line 202, e.g., word line, via subsequent processing steps (not shown), e.g., masking and etching. The conductive line 202 can comprise a metal material such as tungsten, titanium, and titanium nitride, and/or other conductive materials suitable for serving as a conductive line, e.g., word line and/or bit line, for the array 207.

In various previous approaches such as that illustrated in FIG. 2, the conductive plug 213 is planarized, e.g., via CMP, to provide a suitable contact interface 224 with the subsequently formed conductive line 202. As such, formation of the plug 213 and line 202 occur via separate and distinct deposition processes, with a CMP performed in between. Therefore, although the conductive plug 213 and conductive line 202 may comprise the same conductive material, they are formed via separate deposition processes such that an inter-metallic interface 224 exists between them. As noted above, such an interface, e.g., 224, can increase the path resistance associated with a memory cell, e.g., 206, as compared to embodiments of the present disclosure, which can adversely effect the operation thereof. Furthermore, performing separate deposition processes with a CMP therebetween to form plug 213 and line 202 can be time consuming, e.g., due to the performance of two separate depositions processes, and/or costly, e.g., CMP consumables are expensive.

The memory cell 206 can be a memory cell such as cell 106 described in FIG. 1. For instance, the memory cell 206 includes a select device 210 in series with a storage element 212 and formed between conductive line 202 and a conductive line 204, e.g., a bit line. Although the select device 210 is located below the storage element 212, embodiments are not so limited. For instance, the select device 210 can be located above the storage element 212, in a number of embodiments. As an example, the memory cell 206 can be a PCMS cell 206. For instance, the select device 210 can be an ovonic threshold switch (OTS) 210 and the storage element 212 can be a phase change storage element 212.

Although not shown in FIG. 2, the OTS 210 can comprise an OTS material, e.g., a chalcogenide alloy, formed between a pair of electrodes, e.g., electrodes located at interfaces 216 and 217, and the phase change storage element can comprise a phase change material, e.g., a chalcogenide alloy, formed between a pair of electrodes, e.g., electrodes formed at interfaces 217 and 218. In such embodiments, the electrodes can comprise various conductive and/or semiconductive materials such as materials including carbon, for instance. In a number of embodiments, the OTS 210 and phase change storage element 212 can share an electrode, e.g., a shared electrode at interface 217. Also, in a number of embodiments, the conductive lines 202 and/or 204 can serve as electrodes for the select device 210 and storage element 212 or the electrodes at interfaces 216 and/or 218 can be integrated with the conductive lines 202 and 204, respectively.

Figure 3:
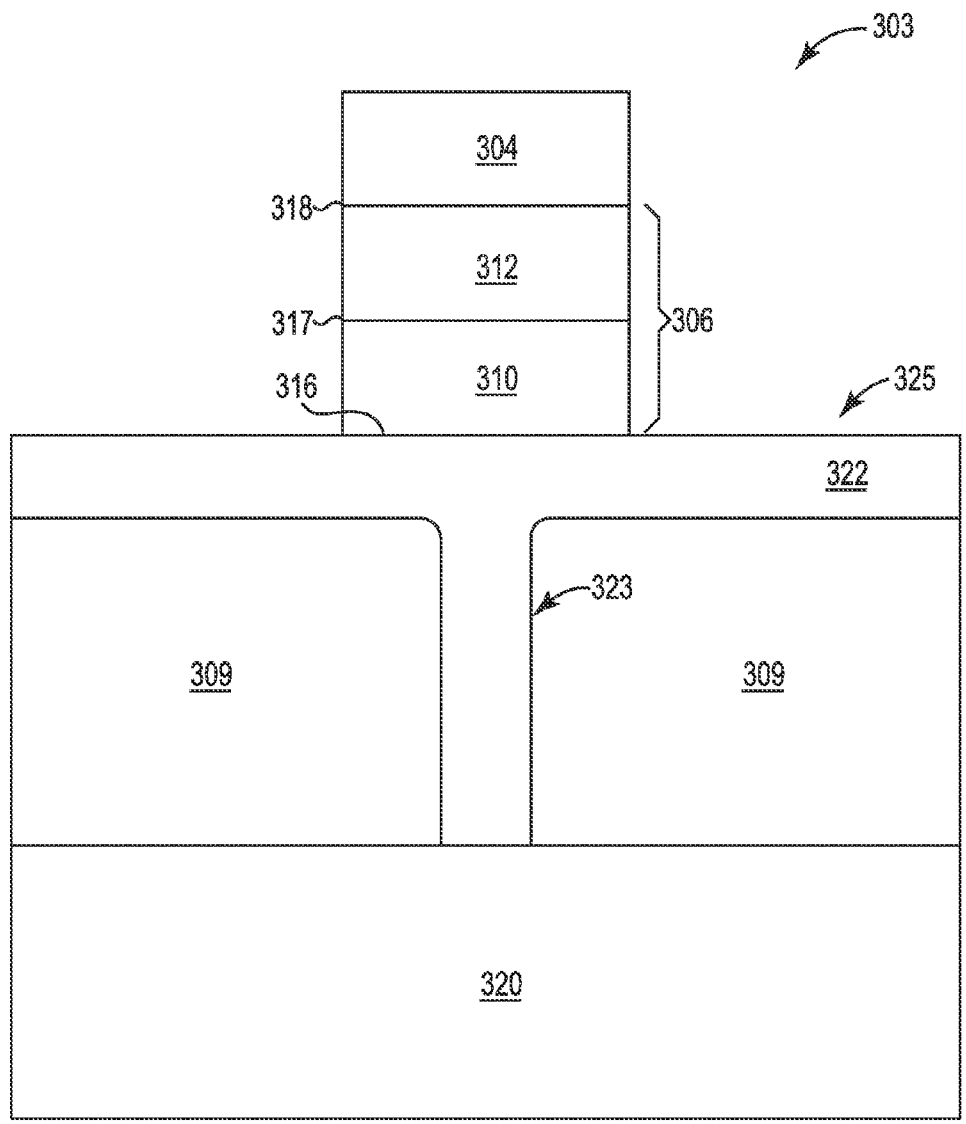
FIG. 3 illustrates a cross-sectional view of a portion of a memory array formed in accordance with a number of embodiments of the present disclosure.

FIG. 3 illustrates a cross-sectional view of a portion of a memory array 303 formed in accordance with a number of embodiments of the present disclosure. For reference purposes, FIG. 3 can represent a cross-section taken along the y-direction (word line direction) through a memory cell 106 shown in FIG. 1.

Array 303 includes a memory cell 306 formed on a substrate 320, which can be analogous to substrate 220 described above in connection with FIG. 2. As such, various circuitry, such as decode circuitry, for instance, associated with operating memory array 303 can be formed in/on substrate 320.

In contrast to the array 207 described in connection with FIG. 2, the array 303 includes a combined, e.g., integrated, conductive plug/conductive line 322, which can serve to electrically couple memory cell 306 to array circuitry, e.g., decode circuitry 420 shown in FIG. 4, associated with operating, e.g., programming, reading, erasing, etc., the array 303. The combined conductive plug/conductive line 322 includes a plug portion 323 and a line portion 325. In a number of embodiments, the combined conductive plug/conductive line 322 is formed of a continuous conductive material, or materials, such that an interface does not exist between the plug portion 323 and the line portion 325, e.g., an interface such as interface 224 between conductive line 202 and plug 213 shown in FIG. 2 does not exist. As such, unlike previous approaches, in a number of embodiments of the present disclosure, a CMP process is not performed between formation of the plug portion 323 and line portion 325, since the integrated conductive plug/conductive line 322 serves as both a conductive line of the array 303 and a conductive plug coupling the conductive line to underlying decode circuitry, for instance. That is, formation of the integrated conductive plug/conductive line 322 does not occur via separate and distinct deposition processes, with a CMP performed in between, such as that described in connection with FIG. 2. As such, the integrated conductive plug/conductive line 322 can provide a reduced path resistance associated with memory cell 306, as compared to memory cell 206, among other benefits.

The integrated conductive plug/conductive line 322 can serve as a word line or a bit line corresponding to memory cell 306, for instance. As an example, the integrated conductive plug/conductive line 322 can be formed by etching a via in a dielectric material 309 formed on substrate 320 and subsequently forming a conductive material on the material 309 and in the via. The substrate 320 and dielectric material 309 can be collectively referred to as a substrate structure, for instance. The conductive material 322 can be formed into one or more individual conductive line portions 325 via subsequent processing steps (not shown), e.g., via masking and etching subsequent to deposition of a material stack on the conductive material 322.

The conductive material 322 can comprise tungsten, titanium, platinum, nickel, strontium, hafnium, zirconium, tantalum, aluminum, oxides and nitrides thereof, and combinations thereof, among various other conductive and/or semiconductive metals, for instance. The conductive material 322 can be formed via a number of deposition processes, e.g., physical vapor deposition (PVD), chemical vapor deposition (CVD), and/or atomic layer deposition (ALD), among others. In a number of embodiments, forming the conductive material 322 can include performing a multi-material deposition process. For instance, the conductive material can be formed via a multi-material deposition process that includes at least two of tungsten, titanium, and titanium nitride. In a number of embodiments, a multi-material deposition process can include deposition of materials using at least two different deposition processes. For example, a first conductive material, e.g., titanium, can be deposited via a PVD process, and a second material, e.g., titanium nitride, can be deposited via a CVD process. However, embodiments are not so limited. For instance, in a number of embodiments, the integrated conductive plug/conductive line 322 can be formed via a single deposition process and/or can comprise one particular material. As one example, the integrated conductive plug/conductive line 322 can be formed via PVD deposition of tungsten.

The memory cell 306 can be a memory cell such as cell 106 described in FIG. 1 or memory cell 206 described in FIG. 2. For instance, the memory cell 306 includes a select device 310 in series with a storage element 312 and formed between conductive line 302 and an integrated conductive plug/conductive line 322. Although the select device 310 is located below the storage element 312, embodiments are not so limited. For instance, the select device 310 can be located above the storage element 312, in a number of embodiments. As an example, the memory cell 306 can be a PCMS cell 306. For instance, the select device 310 can be an ovonic threshold switch (OTS) 310 and the storage element 312 can be a phase change storage element 312.

Although not shown in FIG. 3, the OTS 310 can comprise an OTS material, e.g., a chalcogenide alloy, formed between a pair of electrodes, e.g., electrodes located at interfaces 316 and 317, and the phase change storage element can comprise a phase change material, e.g., a chalcogenide alloy, formed between a pair of electrodes, e.g., electrodes formed at interfaces 317 and 318. In such embodiments, the electrodes can comprise various conductive and/or semiconductive materials such as materials including carbon, for instance. In a number of embodiments, the OTS 310 and phase change storage element 312 can share an electrode, e.g., a shared electrode at interface 317. Also, in a number of embodiments, the integrated conductive plug/conductive line 322 and/or the conductive line 304 can serve as electrodes for the select device 310 and storage element 312 or the electrodes at interfaces 316 and/or 318 can be integrated with the integrated conductive plug/conductive line 322 and the conductive line 204, respectively.

In a number of embodiments, a CMP process can be utilized after the formation of the conductive line/conductive plug 322 to prepare a contact surface thereof for subsequent processing steps, e.g., formation of select device 310 thereon, etc. However, as described above, since plug portion 323 is not formed separately from line portion 325, no interface exists between them. As such, unlike in the previous approach described in connection with FIG. 2, no CMP process is performed between formation of the plug portion 323 and line portion 325 of the integrated plug/line 322.

Figure 4:
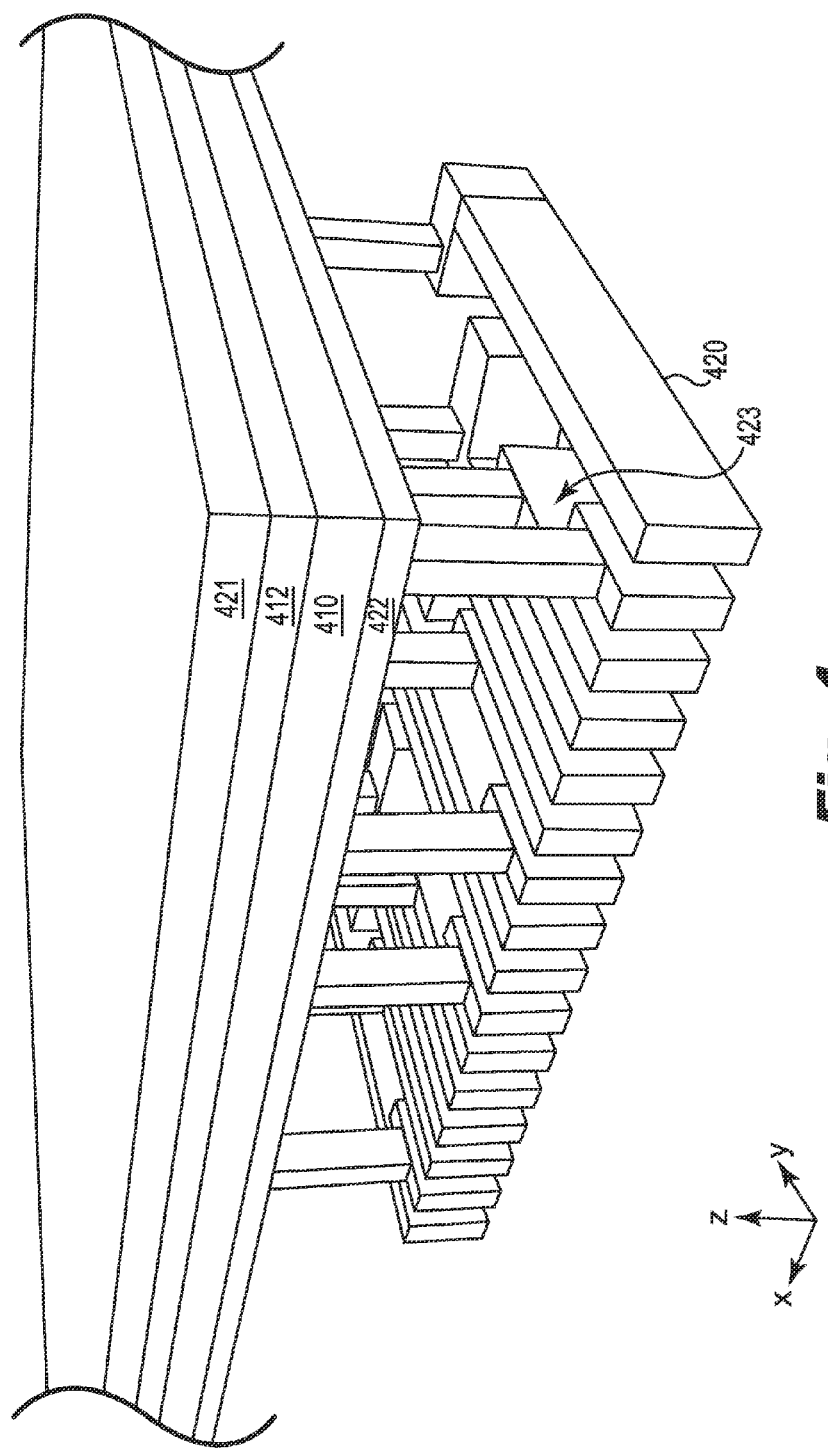
FIG. 4 illustrates a portion of a memory array formed in accordance with a number of embodiments of the present disclosure.

FIG. 4 illustrates a portion of a memory array formed in accordance with a number of embodiments of the present disclosure. The array structure shown in FIG. 4 can represent the array 303 shown in FIG. 3 at a particular process stage, e.g., prior to definition of a number of individual conductive lines such as word lines and/or bit lines.

FIG. 4 illustrates array circuitry 420, e.g., decode circuitry, coupled to a combined conductive line/conductive plug material 422 such as material 322 described in FIG. 3. A stack of materials 410, 412, and 421 is formed on the combined conductive line/conductive plug material 422. As an example, the material 410 can comprise active select device material, e.g., a switching material such as an OTS material, the material 412 can comprise an active storage element material, e.g., a resistance variable material such as a PCM material, and the material 421 can comprise a hard mask material, e.g., a silicon nitride material or other material suitable for serving as a hard mask material during subsequent processing steps, e.g., etching.

As an example, although not illustrated in FIG. 4, individual conductive lines can be defined by patterning, e.g., in the y-direction, and forming a number of trenches through the material stack comprising materials 421, 412, 410, and 422, e.g., via a dry etch process. The conductive lines formed via the patterning and etching process can be combined conductive line/conductive plugs such as combined conductive line/conductive plugs 322 shown in FIG. 3. The combined conductive line/conductive plugs formed of material 422 do not include an interface between a conductive plug portion 423 and a conductive line portion thereof.

Although not illustrated in FIG. 4, after filling with dielectrics and planarization down to the top of the material stack, a conductive line material can then be formed on the material stack and the stack can be patterned and etched, e.g., in the x-direction, thereby defining a number of conductive lines, e.g., bit lines such as bit line 304 shown in FIG. 3, and cell stacks, e.g., cells 306 shown in FIG. 3.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory array, comprising: a memory cell formed between a first conductive line and a second conductive line; wherein the first conductive line comprises a plug portion coupled to array circuitry; and wherein the first conductive line is integrally formed of a continuous conductive material in a T-shape such that an interface does not exist between the plug portion of the T-shaped first conductive line and a line portion of the T-shaped first conductive line; and wherein the memory cell comprises a resistive phase change storage element and a select device; and wherein the select device is an ovonic threshold switch (OTS).

2. The memory array of claim 1, wherein the array circuitry comprises decode circuitry.

3. The memory array of claim 1, wherein the first conductive line is at least one of: a word line; and a bit line.

4. The memory array of claim 1, wherein the phase change storage element comprises a chalcogenide alloy.

5. The memory array of claim 1, wherein the select device and the storage element are two-terminal devices.

6. A memory array, comprising:
a memory cell comprising a select device and a resistive storage element (RSE) formed between a first conductive line and a combined conductive plug/conductive line (CP/CL);
wherein the combined CP/CL is integrally formed into a T-shape that comprises: a plug portion formed in a via and coupled to array circuitry; and a line portion serving as at least one of: a word line and a bit line of the array;
wherein the combined CP/CL is formed of a continuous conductive material; and
wherein the RSE is a resistive phase change storage element and the select device is an ovonic threshold switch (OTS).

7. The memory array of claim 6, wherein the conductive line is a bit line and the line portion of the combined CP/CL is a word line.

8. The memory array of claim 6, wherein the array circuitry comprises decode circuitry.

9. The memory array of claim 6, wherein the conductive material is Tungsten (W).

10. The memory array of claim 6, wherein the conductive material comprises at least two materials selected from the group including:
Tungsten;
Titanium; and
Titanium nitride.

11. The memory array of claim 6, wherein the conductive material is a metallization formed utilizing physical vapor deposition (PVD) and chemical vapor deposition (CVD).

12. The memory array of claim 11, wherein the PVD comprises Titanium (Ti) and the CVD comprises Titanium Nitride (TiN).

13. A memory array, comprising:
an integrated conductive plug/conductive line (CP/CL), comprising an integrally formed continuous conductive material having a T-shape comprising a plug portion and a line portion;
wherein the plug portion is formed in a via and coupled to array circuitry, and the line portion serves as at least one of: a word line and a bit line of the array; and
a memory cell comprising a storage element, a select device, and at least one electrode at a shared interface between the storage element and the select device, formed between the CP/CL and a conductive line.

14. The memory array of claim 13, wherein the conductive line is an electrode for the select device.

15. The memory array of claim 13, wherein the CP/CL serves as a word line of the array and couples the word line to decode circuitry of the array.

16. The memory array of claim 13, wherein the storage element comprises a chalcogenide alloy.

17. The memory array of claim 13, wherein the conductive material is formed utilizing a multi-material deposition comprising at least one material deposition via a physical vapor deposition process and at least one material deposition via a chemical vapor deposition process.

18. The memory array of claim 16, wherein the CP/CL comprises at least two materials selected from the group including:
Tungsten;
Titanium; and
Tantalum.

* * * * *